United States Patent [19]

Craig et al.

[11] Patent Number: 4,636,332
[45] Date of Patent: Jan. 13, 1987

[54] THICK FILM CONDUCTOR COMPOSITION

[75] Inventors: William A. Craig, Bedfordshire, England; Barry E. Taylor, Youngstown, N.Y.

[73] Assignee: E. I. Du Pont de Nemours and Company, Wilmington, Del.

[21] Appl. No.: 794,946

[22] Filed: Nov. 1, 1985

[51] Int. Cl.$^4$ ............................................. H01B 1/06
[52] U.S. Cl. .................................. 252/514; 252/518; 252/519; 252/520; 252/521
[58] Field of Search ............... 252/514, 518, 519, 520, 252/521; 106/1.13–1.15, 1.22, 1.24, 1.25

[56] References Cited

U.S. PATENT DOCUMENTS

| | | | |
|---|---|---|---|
| 4,090,009 | 5/1978 | Horowitz | 252/514 |
| 4,124,539 | 11/1978 | Horowitz et al. | 252/518 |
| 4,160,227 | 7/1979 | Ikegami et al. | 252/514 |
| 4,175,061 | 11/1979 | Fujimura | 252/518 |
| 4,302,362 | 11/1981 | Hoffman et al. | 252/520 |
| 4,362,656 | 12/1982 | Hormadaly | 252/514 |
| 4,381,945 | 5/1983 | Nair | 252/514 |
| 4,394,171 | 7/1983 | Nair | 252/514 |
| 4,414,143 | 11/1983 | Felten | 252/514 |
| 4,532,075 | 7/1975 | Taylor | 252/514 |
| 4,536,328 | 8/1985 | Hankey | 252/518 |
| 4,536,329 | 8/1985 | Hormadaly | 252/518 |
| 4,574,055 | 4/1986 | Asada et al. | 252/514 |

Primary Examiner—Josephine L. Barr

[57] ABSTRACT

Thick film conductor compositions comprising an admixture of finely divided particles of A. noble metal, noble metal alloy or mixtures thereof, and B. inorganic binder comprising a glass corresponding to the formula $Bi_4Si_{3-x}Ge_xO_{12}$, having ZnO dissolved therein, and C. A glass bleed-out inhibitor selected from pyrochlore-related oxides, metal resinates and mixtures thereof, all of A through C being dispersed in D. organic medium.

13 Claims, No Drawings

4,636,332

THICK FILM CONDUCTOR COMPOSITION

FIELD OF INVENTION

The invention relates to thick film conductor compositions and especially to such compositions having good solderability and adhesion to the substrates on which they are employed.

BACKGROUND OF THE INVENTION

The use of thick film conductors in hybrid microelectronic components is well known in the electronic field. Such materials are usually comprised of a dispersion of finely divided particles of a noble metal, noble metal alloy or mixtures thereof and a minor amount of inorganic binder, both dispersed in an organic medium to form a pastelike product. The consistency and rheology of the paste is adjusted to the particular method of application such as screen printing, brushing, dipping, extrusion, spraying and the like. Such pastes are usually applied to an inert substrate such as $Al_2O_3$ by screen printing to form a patterned layer. The patterned thick film conductor layer is then fired to volatilize the organic medium and sinter the inorganic binder, which is usually glass or a glass-forming material.

In addition to the electrical conductivity properties which the fired conductive layer must possess, it is essential that it adhere firmly to the substrate on which it is printed and that the layer be capable of accepting solder. Solderability is, of course, essential because of the necessity of connecting the conductive pattern with other components of the electronic system in which it is used, e.g., resistor and capacitor networks, resistors, trim potentiometers, chip resistors, chip capacitors, chip carriers and the like.

Most firing of thick film materials has been carried out in belt furnaces which utilize as a heat source heavy gauge resistance-wire elements embedded in a refractory surrounding a quartz or metal muffle. Because the mass of such furnaces is high the response of the furnaces is slow and they operate at temperatures close to the temperature of the products being fired therein. Because of this small temperature difference, the rate at which energy is delivered to the product is restricted. Until recently such muffle furnaces were as a practical matter the only viable choice for firing thick films. Using conventional muffle furnaces the firing of thick films is usually carried out using firing profiles of 30-60 minutes duration in which the peak temperature is typically 850° C., heating rate is 35°-100° C./minute, peak dwell time is 5-10 minutes and the cooling rate is 35°-150° C./minute. To provide for safe removal of organic media without blistering, chemical reactions or mechanical strain it was necessary to use relatively slow heat-up rates, long dwell times and controlled slow cooling.

In response, however, to the economic desirability and competitive need to improve productivity by most manufacturers of electronic components who utilize thick film technology, there exists a strong trend toward the use of infrared belt furnaces. Infrared furnaces utilize as energy source a filament of tungsten or nickel-chromium alloy which is heated electrically to a temperature substantially above the chamber or product temperatures. Lamps incorporating these filaments are mounted in arrays above and below the belt. Because of the large temperature differences between the filaments and the parts being fired the furnace can deliver very large amount of energy to the part being fired much more rapidly than in conventional muffle furnaces. Thus, parts that require firing profiles of 20 minutes to peak temperature, 10 minutes at peak temperature and 15 minutes down to 100° C. in conventional belt furnaces can now be fired effectively with profiles of 8½ minutes to peak temperature and 6½ minutes down to 100° C.

As might be expected from the complexity of the many reactions and interactions which take place during firing, it has been found that many materials which are imminently suitable for conventional slow firing are less suitable for more rapid firing in infrared equipment. Thus, while extensive research has been directed to the problems of thick film conductor adhesion and solderability, it has almost entirely been directed to the problems associated with conventional slow firing furnaces and very little has been directed to fast firing in infrared furnaces.

BRIEF DESCRIPTION OF THE INVENTION

The invention is directed broadly to thick film conductor compositions which can be fired in quite short firing times and yet have both good solderability and good adhesion to the substrate on which they are applied.

The invention is directed in its primary aspect to a thick film conductor composition comprising an admixture of:

A. 60–99% wt. finely divided particles of noble metal, noble metal alloy or mixtures thereof, and
B. 40–1% wt. inorganic binder consisting essentially of finely divided particles of
   (1) 100 parts by weight of a glass corresponding to the formula $Bi_4Si_{3-x}Ge_xO_{12}$ where $x=0-3$, having dissolved therein 0–20 pph PbO, basis glass,
   (2) 0–100 pph $Bi_2O_3$, basis glass and Pbo, and
   (3) 4–100 pph ZnO, basis glass and Pbo,
C. A glass bleed-out inhibitor selected from
   (1) 0.2–10% wt., basis solids, of finely divided particles of a pyrochlore-related oxide corresponding to the formula $(M_xM'_{2-x})M''_2O_{7-z}$, wherein M is different than M' and is selected from at least one of Pb, Bi, Cd, Cu, Ir, Ag, Y, rare earth metals having atomic numbers of 57–71 and mixtures thereof, M' is selected from Pb, Bi and mixtures thereof, M" is selected from Ru, Ir, Rh and mixtures thereof, $x=0-0.5$, and $z=0-1$;
   (2) 2–10% wt., basis solids, of a resinate of a metal selected from (a) the noble metals Ru, Rh, Re, Ir, Pt and mixtures thereof, and (b) the non-noble metals Mg, Si, Ti, V, Cr, Mn, Fe, Co, Ni, Cu, Zn, Zr, Nb, Ba, Ce, Ta, W and mixtures thereof, and mixtures of (1) and (2), all of components A through C being dispersed in
D. An organic medium.

In a second aspect, the invention is directed to ceramic substrates having adherent thereon a patterned layer of the above described thick film conductor composition which has been fired to effect volatilization of the organic medium and sintering of the glass.

PRIOR ART

In U.S. Pat. No. 4,532,075, Taylor discloses thick film conductor compositions which contain the above-described inorganic binder (Component B) to improve the solderability and adhesion of conductive metals to substrates when the composition is air-fired in conventional metal furnaces.

DETAILED DESCRIPTION OF THE INVENTION

A. Conductive Phase

Any of the noble metals, their alloys or mixtures thereof may be used as the conductive phase for the composition of the invention. Thus, noble metals such as Ag, Pt and Pd can be used as can their alloys such as Pt/Au, Pd/Ag, Pd/Au and Ag/Pt/Pd.

The noble metal particles, as well as the other solids of the composition of the invention, preferably have a size within the range of 0.5-10 μm and a surface area of 0.8-20 m²/g for noble metals other than Au and 0.1-10 m²/g for Au. Though these ranges are preferred, it should be recognized that these limits are not narrowly critical to the effectiveness of the compositions in use.

The amount of noble metal in the composition relative to total solids will fall within the range of 60-99% wt. of the composition, excluding the organic medium. Most compositions will, however, contain on the order of 75-98% wt. noble metal and complementally 25-2% wt. inorganic binder.

B. Inorganic Binder

As described hereinabove, the inorganic binder phase of the compositions of the invention contains as a principal component a glass corresponding to the formula $Bi_4Si_{3-x}Ge_xO_{12}$, wherein x is 0-3, having dissolved therein 0-100 pph basis glass, of PbO. It is preferred that the amount of germanium in the glass correspond to x values of 0.1-2.9 and still more preferably 0.5-1.5. The glass contains no boron.

Unlike the ZnO and the optional excess $Bi_2O_3$, it is essential that when PbO is used in the glass composition, it must be dissolved in the glass to avoid solderability problems. It cannot effectively be added merely as a further solids component.

The use of PbO in the glass is optional so long as the glass contains some germanium. But to get adequate adhesion it becomes essential if no germanium is contained in the glass, i.e., when x=0. It is, nevertheless preferred to employ 1-20 and preferably 2-10 pph by weight PbO, basis glass, in all compositions.

The glass component of the inorganic binder is prepared by conventional glassmaking techniques by mixing the desired components in the desired proportions and heating the mixture to form a melt. As is well known in the art, heating is conducted to a peak temperature and for a time such that the melt becomes entirely liquid and homogeneous.

In the present work, the component oxides are mixed in any of several ways familiar to those in the art and then melted in a Kyanite ® crucible at 1350° C. for 10-30 minutes. The homogeneous molten glass is then poured into cold water in order to quench the amorphous glass structure. The coarse glass is then placed in a ceramic jar mill with an appropriate amount of water and ceramic media to give efficient size reduction. Milling times of 20-70 hours were generally found to give adequate size reduction.

After discharging the milled frit slurry from the mill, the excess water is removed by decantation and the frit powder is oven dried at a temperature of 150° C. The dried powder is then screened through a 325-mesh stainless steel screen to remove any large particles.

In addition to the glass, which may have PbO dissolved therein, the inorganic component must also contain ZnO and optionally may contain additional $Bi_2O_3$. However these two components, unlike the PbO, must not be dissolved in the glass. To the contrary, they must be added as separate particulate solids. Thus the inorganic binder consists essentially of an admixture of (1) particles of glass in which PbO is dissolved if it is used at all, (2) ZnO particles and optionally (3) $Bi_2O_3$ particles if they are used at all.

It has been found that at least 4 pph by weight ZnO, basis glass and PbO, must be used in the inorganic binder to obtain adequate adhesion and at least 10 pph are preferred. However, if more than about 100 pph are used, solderability is degraded and resistivity tends to be raised.

Even though the addition of $Bi_2O_3$ is not essential, it is nevertheless preferred to use at least 10 pph by weight $Bi_2O_3$, basis glass and PbO, to improve solderability still further. However, if more than about 100 pph are used, the composition tends to lose adhesion.

As discussed hereinabove the inorganic binder portion of the invention may comprise as little as 1% wt. of the total solids and as much as 40% wt. More frequently, however, the amount of inorganic binder will be 2-25% wt. of the total solids and especially 5-15% wt.

Among the many of the above-described glasses which can be used in the invention are the following preferred compositions:

TABLE 1

| Preferred Glass Compositions | | | | |
|---|---|---|---|---|
| $Bi_2O_3.SiO_2.PbO$ Glasses | | | | |
| | Weight % of Oxide | | | |
| | A | B | C | D |
| $Bi_2O_3$ | 81.6 | 79.5 | 77.5 | 75.6 |
| $SiO_2$ | 15.8 | 15.4 | 15.0 | 14.6 |
| PbO | 2.6 | 5.1 | 7.5 | 9.8 |
| $Bi_2O_3.SiO_2.GeO_2$ Glasses | | | | |
| | Weight % of Oxide | | | |
| | E | F | G | H |
| $Bi_2O_3$ | 83.46 | 83.13 | 82.15 | 81.35 |
| $SiO_2$ | 15.60 | 15.01 | 13.24 | 11.80 |
| $GeO_2$ | 0.94 | 1.87 | 4.61 | 6.85 |
| | Weight % of Oxide | | | |
| | I | J | K | |
| $Bi_2O_3$ | 77.58 | 76.17 | 74.81 | |
| $SiO_2$ | 5.00 | 2.46 | — | |
| $GeO_2$ | 17.41 | 21.37 | 25.19 | |
| $Bi_2O_3.SiO_2.GeO_2.PbO$ Glasses | | | | |
| | Weight % of Oxide | | | |
| | L | M | N | |
| $Bi_2O_3$ | 82.15 | 79.05 | 74.81 | |
| $SiO_2$ | 13.24 | 7.64 | — | |
| $GeO_2$ | 4.61 | 13.31 | 25.19 | |
| PbO | 2.70 | 2.70 | 2.70 | |

(1) Theoretical Considerations

Poor solderability of the prior art conductor compositions is believed to have been the result in substantial part of migration of the glass binder component during the sintering operation to the exposed surface of the conductive layer. Thus, during the sintering phase of the firing process, the glass tends to "bleed-out" from the interior of the thick film dispersion and to concentrate at the exposed surface. In this manner, it forms a surface layer which is virtually all glass to which solder is only limitedly adherent if at all. Glass bleed-out and poor solderability are problems which occur frequently in thick film noble metal conductors, particularly thick film palladium-silver conductors. Although their causes are not fully understood, it is believed that both problems are related to the chemical and physical phenomena which occurred during the firing cycle. To achieve the desired combination of electrical and physical properties for the thick film conductor, it is important to balance the reactivity of the glass and binder constituents with the burn-out properties of the organic constituents. Because of the complexity of the reacting species, the choice of materials at the current status of the technology must be done empirically.

The particular glasses used in the invention are designed to give minimum interaction (i.e., reduction to elemental metal). It has been found that in lead-containing glasses, reduction of the lead oxide to lead metal enhances sintering of palladium silver metal films; but if too much lead metal is present or if the glass concentration is too high, glass bleed-out can occur. Poor solderability can result from an excess of glass on the conductor surface as described above and/or it may result from stabilization of palladium oxide as in the following reaction sequence:

$$Pb^{2+} + C \longrightarrow Pb^o \quad (1)$$

$$Pb^o + (Pd,Ag) \xrightarrow{850^\circ C.} (Pb,Pd,Ag)_{alloy} \quad (2)$$

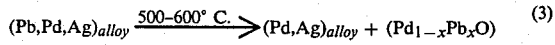

$$(Pb,Pd,Ag)_{alloy} \xrightarrow{500-600^\circ C.} (Pd,Ag)_{alloy} + (Pd_{1-x}Pb_xO) \quad (3)$$

The formation of $Pd_{1-x}Pb_xO$ on the surface of the conductor causes poor solderability because it is not able to be reduced by typical solder alloys (e.g., 62Sn/36Pb/2Ag). Therefore, in order to minimize glass bleed-out and maintain excellent solderability under a wide variety of firing conditions, it is necessary to provide a conductor structure that will allow controlled sintering of the metal powders and simultaneously facilitate migration of the glass to the conductor/substrate interface. Minimizing both reactivity of the glass phase and the amount of constituents such as lead oxide in the glass phase contribute significantly to solution of the bleed-out/solderability problem. However, to utilize fully the above described glasses under extremely fast firing conditions (e.g., infrared firing and 15-min. conventional firing profiles), it is necessary also to control the sintering rate of the noble metals themselves. This is accomplished by using either or both of two types of primary glass bleed-out inhibitors—certain pyrochlore-related oxides and metal resinates.

(2) Pyrochlore-Related Oxide

The pyrochlore-related oxides which can be used in the invention are those corresponding to the formula $(M_xM'_{2-x})M''_2O_{7-z}$, wherein M is different than M' and is selected from at least one of Pb, Bi, Cd, Cu, Ir, Ag, Y, rare earth metals having atomic numbers of 57–71 and mixtures thereof, M' is selected from Pb, Bi and mixtures thereof, M'' is selected from Ru, Ir, Rn, and mixtures thereof, x=0–0.5, and z=0–1.

Those pyrochlore-related oxides in which M is Cu, M' is Bi and M'' is Ru are particularly preferred. Of these the compound $Cu_{0.5}Bi_{1.5}Ru_2O_{6.75}$ has been found to be particularly effective.

Materials of this type are well-known in the thick film resistor art and can readily be made by the processes disclosed in U.S. Pat. No. 3,583,931 to Bouchard and U.S. Pat. No. 4,420,422 to Ferretti.

It is necessary to use at least about 0.2% wt. of the pyrochlore-related oxide in order to obtain significant improvements in solderability. However, if more than about 10% wt. is used, the solderability may be degraded. It is therefore preferred to use 0.2–5% wt. of the pyrochlore-related oxide. Within this range, 1–2% wt. has been found to be optimum.

(3) Metal Resinate

As used herein, the term "metal resinate" refers to organic metallic compounds which are soluble in organic media.

One type of metal resinate is the reaction product of any of several organic compounds with a metal salt. The resulting compound is essentially a long chain organic molecule in which one site is occupied by one of a wide variety of metals. Another type of metal resinate is a chelate-type compound such as an organotitanate.

Metal resinates may range from highly fluid to very viscous liquids and to solids as well. From the standpoint of use in the invention, the solubility of the resinates in the organic medium is of primary importance. Typically, metal resinates are soluble in organic solvents, particularly polar solvents such as toluene, methylene chloride, benzyl acetate, and the like. Metal resinates and metal resinate solutions of both noble metals and base metals are commercially available. Suitable noble metal resinates are those based on Ru, Rh, Re, Ir, Pt and mixtures thereof. Suitable base metal resinates are those based on Mg, Si, Ti, V, Cr, Mn, Fe, Co, Ni, Cu, Zn, Zr, Nb, Ba, Ce, Ta, W and mixtures thereof.

Suitable organotitanates are those disclosed in U.K. Pat. No. 772,675 and particularly those in which the organotitanates are hydrolyzable metal alcoholates of titanium corresponding to the formula $(AO)_{4x-2y}TiO_y$ in which A is $C_{1-8}$ alkyl or a mixture of $C_{1-8}$ alkyl and $C_{1-8}$ acyl, O is an oxygen atom covalently bonding two titanium atoms, x is an integer from 1 to 12 and y is 0 or an integer from 1 to 3x/2. The alkyl groups may be either straight chained or branched. Preferred organotitanates include titanium acetyl acetonate and tetraoctylene glycol titanium chelate. Other organotitanates of this type are disclosed in Ken-React Bul. No. KR-0278-7 Rev. (Kenrich Petrochemicals, Inc., Bayonne, N.J.) and in Du Pont Bul. No. E-38961 entitled Versatile Tyzor Organic Titanates.

The metal resinates are used in the compositions of the invention in concentrations of 0.5–10% wt., basis solids, and preferably 1–5% wt. As with the pyrochlore-related bleed-out inhibitors, the use of amounts of resinate higher than 10% wt. tends to lower solderability and to raise resistivity excessively, while the use of less than 0.5% wt. resinate tends to be insufficiently effective to reduce bleed-out.

D. Organic Medium

A further important component of the compositions in accordance with the invention is the organic medium. The main purpose of the organic medium is to serve as a vehicle for dispersion of the finely divided solids of the composition in such form that it can readily be applied to ceramic or other substrates. Thus, the organic medium must first of all be one in which the solids are dispersible with an adequate degree of stability. Secondly, the rheological properties of the organic medium must be such that they lend good application properties to the dispersion.

Most thick film compositions are applied to a substrate by means of screen printing. Therefore, they must have appropriate viscosity so that they can be passed through the screen readily. In addition, they should be thixotropic in order that they set up rapidly after being screened, thereby giving good resolution. While the rheological properties are of primary importance, the organic medium is preferably formulated also to give appropriate wettability of the solids and the substrate, good drying rate, dried film strength sufficient to withstand rough handling, and good firing properties. Satisfactory appearance of the fired composition is also important.

In view of all these criteria, a wide variety of liquids can be used as organic medium. The organic medium for most thick film compositions is typically a solution of resin in a solvent frequently also containing thixotropic agents and wetting agents. The solvent usually boils within the range of 130°–350° C.

By far the most frequently used resin for this purpose is ethyl cellulose. However, resins such as ethylhydroxyethyl cellulose, wood rosin, mixtures of ethyl cellulose and phenolic resins, polymethacrylates of lower alcohols, and monobutyl ether of ethylene glycol monoacetate can also be used.

Suitable solvents include kerosene, mineral spirits, dibutylphthalate, butyl carbitol, butyl carbitol acetate, hexylene glycol and high-boiling alcohols and alcohol esters. Various combinations of these and other solvents are formulated to obtain the desired viscosity, volatility and compatibility with dielectric tape. Water-soluble solvent systems can also be used.

Among the thixotropic agents which are commonly used are hydrogenated castor oil and derivatives thereof and ethyl cellulose. It is, of course, not always necessary to incorporate a thixotropic agent since the solvent/resin properties coupled with the shear thinning inherent in any suspension may alone be suitable in this regard. Suitable wetting agents include phosphate esters and soya lecithin.

The ratio of organic medium to solids in the paste dispersions can vary considerably and depends upon the manner in which the dispersion is to be applied and the kind of organic medium used. Normally, to achieve good coverage, the dispersions will contain complementally by weight 40–90% solids and 60–10% organic medium.

The pastes are conveniently prepared on a three-roll mill. The viscosity of the pastes is typically 2–50 Pa.s when measured at room temperature on Brookfield viscometers at low, moderate and high shear rates. The amount and type of organic medium (vehicle) utilized is determined mainly by the final desired formulation viscosity and print thickness.

In many instances, the organic medium does not play an important role in the functional properties of the microcircuit conductor. However, with respect to the composition of the invention, it has been found that the organic medium can have a significant role in determining conductor performance. Thus the wrong choice of organic vehicle can result in high resistivity and poor aged adhesion of the fired conductor film. To avoid these potential problems, the organic vehicle must give excellent dispersion and must burn out cleanly at a low temperature (400°–450° C.) in the firing cycle.

In view of these criteria, a preferred vehicle system for the present invention consists of ethyl cellulose polymers dissolved in a mixture of $\beta$-terpineol, dibutyl carbitol, and dibutylphthalate solvents. A thixotropic agent is generally added to give improved line resolution with screen printing.

E. Other Additives

In addition to the above-described basic components of the conductor compositions of the invention, it has been found that in cases where it is desired to obtain still higher aged adhesion levels after several firing cycles it is useful to add to the compositions 0.1–2.9% wt. NiO, $Co_3O_4$, $SnO_2$ or mixtures thereof. It is preferred to use 0.3–1.0% wt. of these adhesion additives, basis total solids. This addition of supplemental metal oxides is especially desirable in situations where the parts have to undergo firing with both fast and slow firing cycles. For example, because of the known, predictable resistor tolerances that can be achieved with conventional firing, some applications may require a slow firing after most or all of the fast firing (IR) steps have been completed.

F. Formulation and Application

The compositions of the present patent are pastes composed of inorganic oxides and glass powders, precious metal powders such as silver, palladium, platinum and gold, and an organic vehicle which is used to disperse the oxides, glass and metal powders. The resultant material should be easily screen printable by techniques commonly used in the electronics industry. The various powders and organic vehicle are first blended by using commercial blending equipment such as a Hobart ® mixer and then sufficiently dispersed on a three-roll mill. The resultant paste is often screened through a 325–400 mesh stainless steel screen to remove any metal flakes which might have resulted from the roll milling operation.

G. Test Procedures

Aged Adhesion: The adhesion after thermal aging is determined as follows. Parts are printed on 96% alumina substrates such as Alsimag ® 614 (tradename of 3M Company, Minneapolis, Minn. for aluminum magnesium silicon oxides). The screen used generally is a 200-mesh screen with 1.6–2.1 mil (38–53 $\mu$m, diameter stainless steel mesh. The wire is mounted so that the mesh wires run parallel to the frame of the screen. The pattern is defined by a pattern photoimaged on an emulsion applied to the mesh and developed chemically to form a stencil through which the thick film paste is applied to the substrate. The pattern for the adhesion test has nine pads, each 80 mils square, arranged to form a 3×3 grid of pads on a 1"×1" (2.5×2.5 cm) substrate. The photographic emulsion generally extends 0.5–1.0 mil (13–25 $\mu$m) below the wire mesh on the bottom of the screen to allow a thicker print and to seal off the pattern at the substrate surface to provide better resolution. The screen printer is generally set to have a 25 mil (635 $\mu$m) gap between the screen and the substrate to be printed upon.

The squeegee that forces paste through the stencil is made of hard rubber or a synthetic material such as Viton ® fluoroelastomer of 50–90 durometer hardness rating. (Viton ® is a registered trademark of E. I. du Pont de Nemours and Company, Inc., Wilmington, Del.) Downward pressure, typically about 1 pound per inch of squeegee length, is exerted on the squeegee. The squeegee sweeps ink across the pattern at 3–10 inches/second (7.5–25 cm) typically.

The printed parts are dried 5–15 minutes at 80°–150° C. They are then fired. When the parts were fired in a conventional belt furnace the firing cycle consisted of 16–17 minutes ramp up to the peak temperature of 850° C., and 13–14 minutes ramp down to 100° C. When the parts were fast fired, the firing cycle consisted 8½ minutes ramp up to the peak temperature of 850° C. and 6½ minutes ramp down to 100° C.

The pads for which data are given in Table 2 were each fired 5 times plus an additional heating step in which the pad was heated to 500° C. (designed as 5X+500) to simulate the added thermal rigors of subsequent resistor encapsulation with glass.

After firing is completed, the parts have wires attached as follows. Wires are clipped onto the substrate so that they each run down the center of three pads. Then the wires/fired parts are dipped into Alpha 611 solder flux. The parts are then prewarmed on the solder bath and dipped for 10 seconds and allowed to cool. Residual solder flux is cleaned from the soldered wired parts with $CH_2Cl_2$/methanol mixture. Parts are placed in an oven at 150° for 48 hours, then removed and cooled.

The aged parts are placed in an apparatus for measuring the force necessary to separate the wire from the substrate. The force necessary is recorded. Also, the type of separation is noted, i.e., whether separation involves the wire pulling out of the solder pulls off the substrate. Over 15 newtons indicates good adhesion and over 20 newtons is excellent adhesion. Adhesion values of 12–14 newtons are marginal and below 12 is unacceptable.

Solderability: Using a paste formulated in the manner described above, a ⅞ inch × ⅞ inch (2.2 × 2.2 cm) pattern is printed upon a 96% alumina substrate (Alsimag ® 614) and then dried and fired in the manner described above for the aged adhesion test. The printed and fired substrate is dipped into solder flux (Alpha 611) to coat the substrate. The fluxed substrate is then heated briefly (ca. 2 seconds) over a solder pot which contains 62/36/2 Sn/Pb/Ag solder heated to 220° C. After heating, the substrate is immersed into the solder for 5 seconds, removed and rinsed with a solution of methanol and methylene chloride. The solderability of the substrate is then evaluated by visual examination using the following criteria:

| | | |
|---|---|---|
| Excellent (E) | Total coverage | 100% Solder Area |
| Very Good (V) | Few pinholes in pattern | 98–99% |
| Good (G) | Few pinholes in pattern plus 1 or 2 unsoldered areas on the pad | 96–97% |
| Fair (F) | Several unsoldered areas on the pads | 92–95% |
| Poor (P) | 10% or more unsoldered | 90% |

In the examples which follow, glass composition B was used as the inorganic binder component and the primary inorganic solids, excluding the bleed-out inhibitor, consisted on a weight basis of 63.0% Ag, 21.0% Pd, 9.6% glass, 5.1% $Bi_2O_3$ (optional) and 1.3% ZnO (optional). The primary solids were dispersed in 21.5% wt. organic medium.

EXAMPLES

Examples 1–18

A series of conductor compositions was prepared in the manner outlined above and screen printed on alumina to form test pads which were fired with conventional firing times and then evaluated for aged adhesion and solderability. The composition and properties of the fired compositions are given in Table 2 below.

TABLE 2

EFFECT OF PYROCHLORE ADDITION ON FIRED CONDUCTOR PROPERTIES - CONVENTIONAL FIRING TIMES

| | Example No. | | | | | | | | |
|---|---|---|---|---|---|---|---|---|---|
| | 1 | 2 | 3 | 4 | 5 | 6 | 7 | 8 | 9 |
| % wt. Pyrochlore | None | None | None | 2.0 | 2.0 | 2.0 | None | None | None |
| Print Thickness, nm | | | | | | | | | |
| Dried | 25.0 | 25.0 | 25.0 | 23.0 | 23.0 | 23.0 | 23.0 | 23.0 | 23.0 |
| Fired | 14.2 | 14.2 | 14.2 | 18.5 | 18.5 | 18.5 | — | — | — |
| No. of Firing Cycles | 1× | 5× | 5× +500 | 1× | 5× | 5× +500 | 1× | 5× | 5× +500 |
| Resistivity, mΩ/□ | 22 | 22 | 23 | 25 | 25 | 25 | — | — | — |
| Aged Adhesions, Newtons | 30 | 27 | — | 31 | 30 | — | 28 | 22 | — |
| Solderability | E | E | E | F/P | E | E | G | E | E |
| | | | 96% $Al_2O_3$ - 1st source | | | | 96% $Al_2O_3$ - 2nd source | | |

| | Example No. | | | | | | | | |
|---|---|---|---|---|---|---|---|---|---|
| | 10 | 11 | 12 | 13 | 14 | 15 | 16 | 17 | 18 |
| % wt. Pyrochlore | 2.0 | 2.0 | 2.0 | None | None | None | 2.0 | 2.0 | 2.0 |
| Print Thickness, nm | | | | | | | | | |
| Dried | 23.0 | 23.0 | 23.0 | 24.0 | 24.0 | 24.0 | 24.0 | 24.0 | 24.0 |
| Fired | — | — | — | — | — | — | — | — | — |
| No. of Firing Cycles | 1× | 5× | 5× +500 | 1× | 5× | 5× +500 | 1× | 5× | 5× +500 |
| Resistivity, mΩ/□ | — | — | — | — | — | — | — | — | — |
| Aged Adhesions, Newtons | 29 | 27 | — | 12 | 4 | — | 25 | 9 | — |
| Solderability | F | E | E | E | E | P | F/G | G | P |
| | 96% $Al_2O_3$ - 2nd source | | | | | | 96% $Al_2O_3$ - 1st source | | |

TABLE 2-continued

EFFECT OF PYROCHLORE ADDITION ON FIRED CONDUCTOR PROPERTIES - CONVENTIONAL FIRING TIMES

Du Pont Thick Film Dielectric 5704

Pyrochlore: $Cu_{0.5}Bi_{1.5}Ru_2O_{6.75}$
Length of Firing Cycle: 30 minutes
Pad Size: 7/8" × 7/8 (2.2 × 2.2 cm)

The data in Table 2 show clearly that the addition of the pyrochlore related oxide to the conductor compositions is harmful to solderability when the parts are fired once using a conventional long (30 minute) firing cycle. In some instances, solderability is adversely affected when the parts are fired five times using a long firing cycle. In no instance was any benefit to solderability observed by the addition of the pyrochlore-related oxide. In addition, aged adhesion did not appear to be affected by pyrochlore addition.

Examples 19-24

A second series of conductor compositions was prepared in the manner outlined above and screen printed on alumina to form test pads which were fast fired in an infrared furnace and then evaluated for aged adhesion and solderability. The composition and properties of the fired conductors are given in Table 3 below.

TABLE 3

EFFECT OF PYROCHLORE ADDITION ON FIRED CONDUCTOR PROPERTIES-FAST FIRING TIMES

| | Example No. | | | | | |
|---|---|---|---|---|---|---|
| | 19 | 20 | 21 | 22 | 23 | 24 |
| % wt. Pyrochlore | None | 2.0 | 2.0 | None | 2.0 | 2.0 |
| No. of Firing Cycles | 5 | 5 | 5 | 6 | 6 | 6 |
| Pad Size, mm | 2 × 2 | 2 × 2 | 2 × 2 | 1.25 × 1.25 | 1.25 × 1.25 | 1.25 × 1.25 |
| Resistivity, mΩ/□ | 24 | 27 | 27 | — | — | — |
| Aged Adhesions, | | | | | | |
| Initial | 23.9 | 28.6 | 28.8 | 18 | 22 | 22.7 |
| Aged | 25.9 | 24.3 | 22.1 | — | — | — |
| Solderability | * | E | E | * | E | E |

*Nonsolderable
Pyrochlore: $Cu_{0.5}Bi_{1.5}Ru_2O_{6.75}$
Length of Firing Cycle: 15 minutes The data in Table 3 show that the addition of the pyrochlore-related oxide to the conductor composition is quite beneficial to solderability when the parts are fired using a short (15 minute) infrared firing cycle. This is true for multiple firing as well as single firings. For this reason it can be seen that the efficacy of pyrochlore addition is quite unexpectedly unique to such short firing cycles and is not applicable to conventionally long firing cycles. The pyrochlore addition had no appreciable affect on adhesion of the fired parts however.

Examples 25-29

A series of conductor compositions containing small amounts of supplemental metal oxides was prepared in the manner outlined above and screen printed on alumina to form test pads which were fast fired five times, fired on a conventional 30-60 minute firing profile 1-2 times and then evaluated for aged adhesion and solderability. The data in Table 4 below show that the supplemental metal oxides were quite effective in raising aged adhesion to even higher levels. All the compositions exhibited satisfactory solderability.

TABLE 4

Effect of Supplemental Metal Oxide Addition on Aged Adhesion

| | Example No. | | | | |
|---|---|---|---|---|---|
| | 25 | 26 | 27 | 28 | 29 |
| Pyrochlore, % wt. | 2.0 | 2.0 | 2.0 | 2.0 | 2.0 |
| NiO, % wt. | — | — | 1.0 | — | — |
| $Co_3O_4$, % wt. | — | — | — | 0.5 | — |
| $SnO_2$, % wt. | — | — | — | — | 1.0 |
| Aged Adhesions, Newtons | 17 | 18 | 27 | 25 | 22 |

Pyrochlore: $Cu_{0.5}Bi_{1.5}Ru_2O_{6.75}$
Pad Size 2 × 2 mm

EXAMPLES 30 AND 31

Two conductor compositions containing metal resinate as the glass bleed-out inhibitor were prepared in the manner described above and screen printed onto alumina to form test pads which were fast fired and then evaluated as to solderability. Both of the compositions shown in Table 5 had excellent solderability.

TABLE 5

Effect of Metal Resinate Addition on Fired Conductor Properties

| | Example No. | |
|---|---|---|
| | 30 | 31 |
| % wt. Metal resinate | 1.0 | 2.0 |
| No. of firing cycles | 5 | 5 |
| Pad size, mm | 2 × 2 | 2 × 2 |
| Solderability | E | E |
| Resinate metal | Rh | Rh |
| Length of firing cycle, min. | 15 | 15 |

We claim:
1. A thick film conductor composition comprising an admixture of finely divided particles of
   A. 60-99% wt. of noble metal, noble metal alloy or mixtures thereof,
   B. 40-1% wt. inorganic binder consisting essentially of finely divided particles of
      (1) 100 parts of a glass corresponding to the formula $Bi_4Si_{3-x}Ge_xO_{12}$, wherein x=0-3 having dissolved therein 0-20 pph PbO, basis glass, (2)

(2) 0–100 pph $Bi_2O_3$, basis glass and PbO, and (3) 4–100 pph ZnO, basis glass and PbO, C. A glass bleed-out inhibitor selected from
  (1) 0.2–10% wt., basis solids, of finely divided particles of a pyrochlore-related oxide corresponding to the formula $(M_xM'_{2-x})M''_2O_{7-z}$, wherein M is different than M and is selected from at least one of Pb, Bi, Cd, Cu, Ir, Ag, Y, rare earth metals having atomic numbers of 57–71 and mixtures thereof, M' is selected from Pb, Bi and mixtures thereof, M" is selected from Ru, Ir, Rh and mixtures thereof, $x=0-0.5$, and $z=0-1$;
  (2) 2–10% wt., basis solids, of a resinate of a metal selected from (a) the noble metals Ru, Rh, Re, Ir, Pt and mixtures thereof, and (b) the non-noble metals Mg, Si, Ti, V, Cr, Mn, Fe, Co, Ni, Cu, Zn, Zr, Nb, Ba, Ce, Ta, W and mixtures thereof, and mixtures of (1) and (2), all of components A through C being dispersed in D. an organic medium.

2. The composition of claim 1 which also contains 0.1–2.0% wt., basis total solids, of a metal oxide selected from NiO, $Co_3O_4$, $SnO_2$ and mixtures and precursors thereof.

3. The composition of claim 1 in which the bleed-out inhibitor is a pyrochlore-related oxide.

4. The composition of claim 3 in which the pyrochlore-related oxide is $Cu_{0.5}Bi_{1.5}Ru_2O_{6.75}$.

5. The composition of claim 3 which contains 0.2–5% wt. pyrochlore-related oxide.

6. The composition of claim 1 in which the bleed-out inhibitor is a metal resinate.

7. The composition of claim 6 which contains 1–5% wt. metal resinate.

8. The composition of claim 7 which contains 0.1–2% wt., basis total solids, of a metal oxide selected from NiO, $Co_3O_4$, $SnO_2$ and mixtures and precursors thereof.

9. The composition of claim 5 in which the metal resinate is a noble metal resinate.

10. The composition of claim 6 in which the noble metal resinate is rhodium resinate.

11. The composition of claim 1 in which $x=0$.

12. The composition of claim 1 in which $x=0.1-2.9$.

13. The composition of claim 1 in which the x value of the glass is 0.2–2 and the glass has 1–20 pph PbO dissolved therein.

* * * * *

UNITED STATES PATENT AND TRADEMARK OFFICE
CERTIFICATE OF CORRECTION

PATENT NO. : 4,636,332

DATED : January 13, 1987

INVENTOR(S) : William A. Craig & Barry E. Taylor

It is certified that error appears in the above-identified patent and that said Letters Patent is hereby corrected as shown below:

Column 13, line 6, the formula "$(M_x M_{2-x}')$" should read -- $(M_x M'_{2-x})$ --.

Signed and Sealed this

Thirteenth Day of October, 1987

*Attest:*

DONALD J. QUIGG

*Attesting Officer*           *Commissioner of Patents and Trademarks*